(12) United States Patent
Dobler et al.

(10) Patent No.: US 7,905,632 B2
(45) Date of Patent: Mar. 15, 2011

(54) PROJECTION MODULE FOR A HEADLAMP OR AN AUTOMOBILE LIGHT

(75) Inventors: Karl-Otto Dobler, Reutlingen (DE); Andres Faehnle, Wannweil (DE); Thomas Wezel, Reutlingen (DE)

(73) Assignee: Automotive Lighting Reutlingen GmbH (DE)

( * ) Notice: Subject to any disclaimer, the term of this patent is extended or adjusted under 35 U.S.C. 154(b) by 275 days.

(21) Appl. No.: 12/199,987

(22) Filed: Aug. 28, 2008

(65) Prior Publication Data

US 2009/0096341 A1 Apr. 16, 2009

(30) Foreign Application Priority Data

Oct. 15, 2007 (DE) .......................... 10 2007 049 310

(51) Int. Cl.
*F21V 29/00* (2006.01)
(52) U.S. Cl. ........ 362/294; 362/373; 362/545; 362/547; 362/549
(58) Field of Classification Search .................. 362/294, 362/545, 547, 549, 373, 97.3
See application file for complete search history.

(56) References Cited

U.S. PATENT DOCUMENTS

| | | | |
|---|---|---|---|
| 6,582,100 B1 * | 6/2003 | Hochstein et al. ............ | 362/294 |
| 7,093,964 B2 * | 8/2006 | Bynum .......................... | 362/488 |
| 7,344,296 B2 * | 3/2008 | Matsui et al. ................. | 362/652 |
| 7,728,231 B2 * | 6/2010 | Matsui et al. ................. | 174/252 |
| 2008/0037255 A1 * | 2/2008 | Wang ............................ | 362/294 |

* cited by examiner

*Primary Examiner* — Robert May
(74) *Attorney, Agent, or Firm* — Donald R. Boys; Central Coast Patent Agency, Inc.

(57) ABSTRACT

The invention relates to a illumination module (10; 10*a*; 10*b*) for a headlamp or a illumination system of an automobile with at least one semiconductor light source (5) secured to a carrier element (4). The carrier element (4) in turn is attached to a heat sink (7) and fixed in place by means of a separate securing bracket (18; 18*a*; 18*b*) that is plate-shaped or is in the form of a wire-bale spring. The securing bracket (18; 18*a*; 18*b*) is attached to the heat sink (7) and includes a recess that at least partially surrounds the carrier element (4).

16 Claims, 5 Drawing Sheets

PROJECTION MODULE FOR A HEADLAMP OR AN AUTOMOBILE LIGHT

CROSS-REFERENCE TO RELATED DOCUMENTS

The present application claims priority to a German patent application serial number DE 10 2007 049 310.1, which was filed on Oct. 15, 2007, which is incorporated herein in its entirety, at least by reference.

BACKGROUND OF THE INVENTION

Field of the Invention

The invention relates to a illumination module for a headlamp or a illumination system of an automobile with at least one semiconductor light source (5) secured to a carrier element, whereby the carrier element in turn is attached to a heat sink.

BRIEF SUMMARY OF THE INVENTION

Semiconductor light sources (so-called Light-Emitting Diodes, LED's) are being used increasingly in automobile illuminations, particularly in headlamps and illumination systems. For use in automobile headlamps, high light output is required, so that the LED's must be driven by relatively high-strength current. Such high-output LED's are described in patent document WO 20071023439 A2. The high current strength can lead to significant heating of the LED's. This may detract from the proper function, particularly long-term function, of the LED's. It is therefore worthwhile to provide heat sinks to absorb the heat from the LED's, and to dissipate it to ambient air.

FIG. 4a shows essential components of a semiconductor headlamp 1 that are known to the inventor and for which a patent has been applied (DE 10 2007 040 728), but that have not been published. A reflector 3 in the form of a so-called half-shell reflector is mounted within a housing (not shown). A carrier element 4 is located near the focal point, onto which several (in the illustrated example, two) LED's 5 are mounted. The light module shown is configured as a reflection module.

The carrier element 4 is attached to a heat sink 7 using attaching hardware (e.g., screws or rivets). FIG. 4b shows a detailed view of the carrier element 4. To secure the carrier element, drilled holes 9 are provided in the area to the side of the LED's 5 through which the attaching hardware is guided before being attached to the heat sink 7. The attaching elements 6 or the screw heads are counter-sunk in the carrier element. For this, recesses 9a are formed around the drilled holes 9. These drilled holes 9 may also be in the form of a groove, or even open to the outside.

The heat sink 7 includes means by means of which the attaching elements 6 provide a secure connection. These are, for example, formed as drilled holes with interior threads with which the outer threads of the screws 6 may engage. Alternatively, the means are simply formed as drilled holes into which rivets 6 are placed.

A complete semiconductor-light source headlamp may consist of several light modules, whereby several light modules to fulfill an illumination function or each light module fulfills its own function, such as for example the functions of dimmed headlights, bright headlights, daytime running lights, parking lights, fog lamps, backup lights, brake lights, turn-signal lights, etc.

FIG. 5 shows a detailed view of the configured carrier element 4 on a heat sink 7. The carrier element 4 is attached to the heat sink 7 with two screws 6 to the side of the LED's. The heat sink 7 is here shown in a simplified manner as a block. The two LED's 5 are provided electrical contact via flexible conductors or conductor rails 8, so-called current bands.

The described method of securing a carrier element to a heat sink may lead to problems since the position of the securing elements are firmly dictated by the optical configuration of the light module (pre-defined position of the LED's with respect to the reflector), and by matching drilled holes in the carrier element. However, in some cases a situation may occur where the securing elements cannot be attached to the heat sink, for example because the required minimum screw-in depth cannot be achieved. In such cases considerable expense may result from the solutions to connecting the carrier elements. The carrier elements are standard components that are produced and sold in great quantity (e.g., under the name LAFLS (Lumileds Automotive Front Lighting Source) of the Philips Lumileds Lighting Company, San Jose Calif.). Alterations regarding the positions of the drilled holes to vary the position of securing elements are practically not possible, or possible only with great cost expense (special production runs, low quantities) and time expense (long delivery times).

It is the task of the invention to devise a means to secure a carrier element with LED's mounted thereon to a heat sink so it will be simpler and more flexible.

To solve this task, starting from the illumination module of the type mentioned at the outset, it is proposed that the carrier element be affixed by means of a separate securing bracket, whereby the securing bracket possesses a recess that at least partially surrounds the carrier element to which the carrier element is attached and which covers the carrier element at least in areas. The securing bracket is preferably plate-shaped, but may alternatively possess another shape, for example it may be shaped as a wire-bale spring. The securing bracket us attached to the heat sink, and exerts at least in areas a contact pressure on the carrier element from above toward the heat sink. The securing bracket thus partially covers the carrier element. At least a portion of the carrier element on which the LED's are mounted must be assigned to the securing bracket in the area of the recess. The invention has the advantage that a standard carrier element may still be used, and the securing elements may be individually positioned by means of proper configuration of the securing brackets. The securing brackets may be designed to have such a large surface that a suitable position for the securing elements may be found in any case.

The carrier element advantageously is not directly attached to the heat sink as usual, but rather is indirectly attached to the heat sink by means of the securing bracket. Screws or other securing elements to secure conventional, known carrier elements to a heat sink may be completely eliminated by the use of the securing bracket. The securing bracket may be secured using other means (e.g., braces, clips, etc. or a combination of various options), and nevertheless ensure positive securing of the carrier element. It is also possible, however, to provide screws or other securing means at a suitable position in order to secure the carrier element.

Advantageous embodiments of this invention are subjects of the Dependent Claims. It is proposed, for example, that the carrier element be connected with the heat sink by means of the securing bracket so that it may be released, and that the securing bracket is attached to the heat sink in an area outside the carrier element. The securing bracket may be attached to the heat sink at almost any position outside the carrier element by means of suitable configuration with some means. This allows easy emplacement of the carrier element onto the heat sink and, as necessary, simple, rapid release of the securing bracket, for example to replace the carrier element and the LED's. Standard carrier elements with LED's mounted on them may still be used thanks to the invention, even for widely-differing light module design. Individual requirements of various light module designs may be met by merely altering the configuration of the securing bracket.

According to an advantageous embodiment, it is proposed that the securing bracket be joined on one side to the heat sink, and be joined in another fashion to the heat sink on the opposing side. This assumes that suitable means such as a hinge-type device is available on the side of the heat sink to join the securing bracket. A hinge-type securing may also be realized in that a groove is formed on the side of the heat sink into which a matching projection extends from an oblique part of the carrier element. After the securing bracket is secured to the joining means, the securing bracket is pivoted over the carrier element and then engaged on the opposite side. This may be accomplished by means of suitable securing means, for example (screws, rivets, etc.), or by means of a clip or engagement connection. For this, the plate-shaped design of the securing bracket possesses an effect similar to a plate spring.

In another embodiment example, it is proposed that the securing bracket be merely screwed to the heat sink (without hinge-like connection between carrier element and heat sink). The screws may be positioned at any location on the securing bracket, e.g., at locations where the necessary screw-in depth of the screw within the heat sink may be achieved, or where the geometric structure of the light module or of the headlamp allows good reach or access.

The invention may basically be used for any headlamps and illumination systems in an automobile. The invention may also be used anywhere in an aircraft that LED's are used (indicator illumination, interior-space illumination, etc.). Use is particularly preferred in a illumination module to create dimmed and/or bright headlights.

It is further proposed that the securing bracket include means to position and secure a flexible circuit board to provide electrical energy to the minimum of one semiconductor light source. The flexible circuit board is preferably connected with, or in contact with, additional illumination modules of the headlamp or of the illumination system. For this, the flexible circuit board preferably extends between the securing bracket and the heat sink. In principle, the flexible circuit board may also extend above the securing bracket. The securing bracket must then include projections (e.g., studs) at suitable locations that engage with matching apertures or recesses in the flexible circuit board, thus holding the flexible circuit board in the desired position.

If the flexible circuit board is to be fed between the securing bracket and the heat sink, it is conceivable for studs projecting downward to be formed on the underside of the securing bracket that engage in matching drilled holes in the top of the heat sink, and that project through matching drilled holes or recesses in the flexible circuit board, thus positioning it. Of course, the projections (e.g., studs) may also extend upward from the heat sink and engage in drilled holes or recesses provided in the securing bracket. The projections (studs) necessary to position the flexible circuit board may also be formed using screws or other securing means that are provided to secure the securing bracket. The illumination module based on the invention may also provide positioning and securing of the flexible circuit board without additional parts.

It is further proposed that the carrier element include at least two cavities into which tongue-shaped spring tabs of the securing bracket exactly fit, and two of these cavities are placed opposite on the carrier element. The cavities thus form a limit stop for the engaging, tongue-shaped spring tabs on three sides and down to the floor. This design ensures that the securing bracket prevents displacement or movement of the carrier element through all dimensions, thus defining and statically affixing the desired position of the LED's with respect to the reflector.

BRIEF DESCRIPTION OF THE SEVERAL VIEWS OF THE DRAWINGS

In the following, advantageous embodiments of the invention will be described in greater detail using Figures, which show:

FIG. 4b detailed view of a carrier element of the known illumination module from FIG. 4a; and FIG. 5 detailed view of the known illumination module of the semiconductor tight source headlamp from FIG. 4a.

DETAILED DESCRIPTION

Halogen or gas-discharge lamps are predominantly used in automobiles for headlamps. In the future, however, so-called Light Emitting Diodes (LED's) are being used in increasing numbers that offer many advantages over other lamp types because of their longer service life, their small outer dimensions, their insensitivity to shock, and their low weight.

Figure 1:
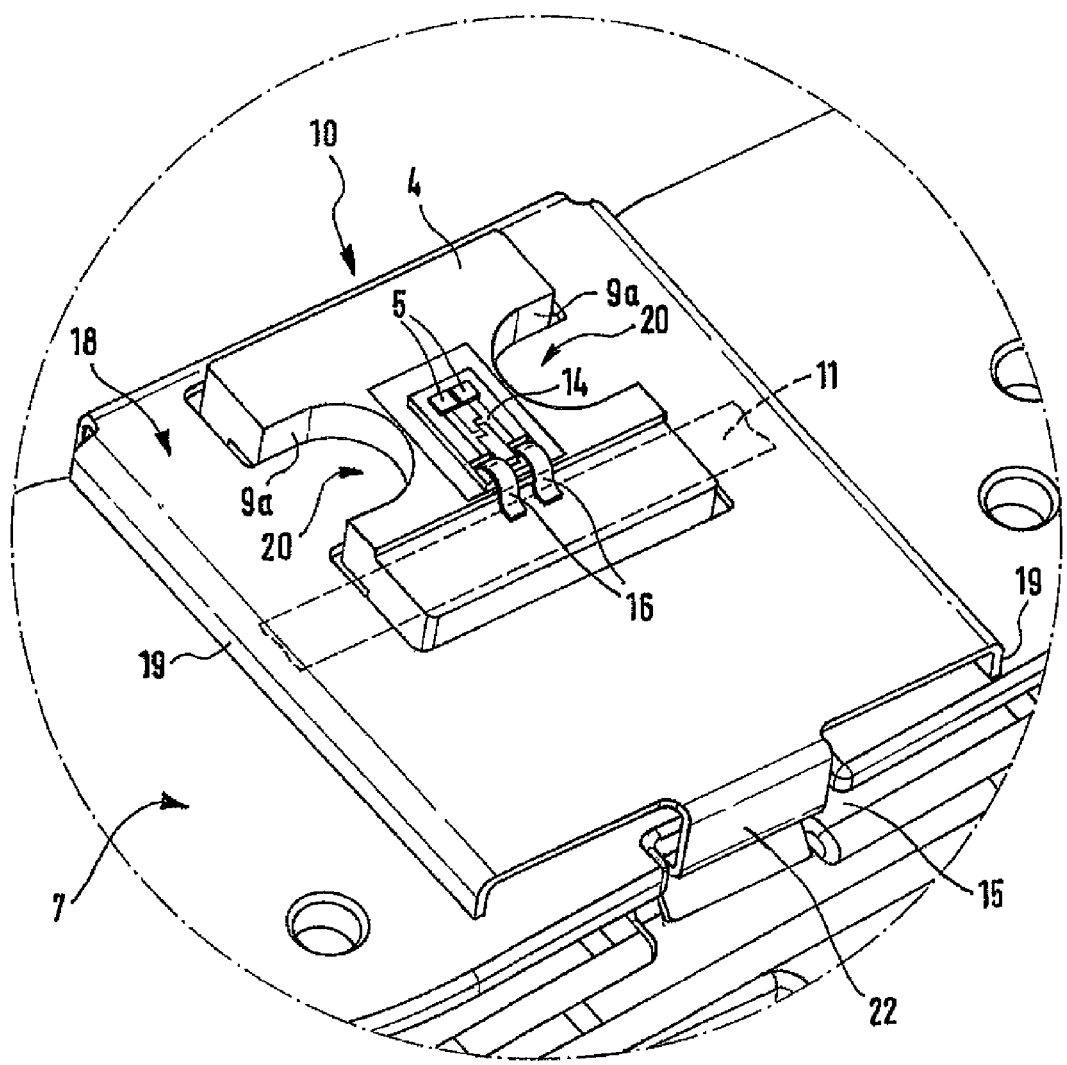
FIG. 1 first advantageous embodiment of an illumination module based on the invention.
Figure 4A:
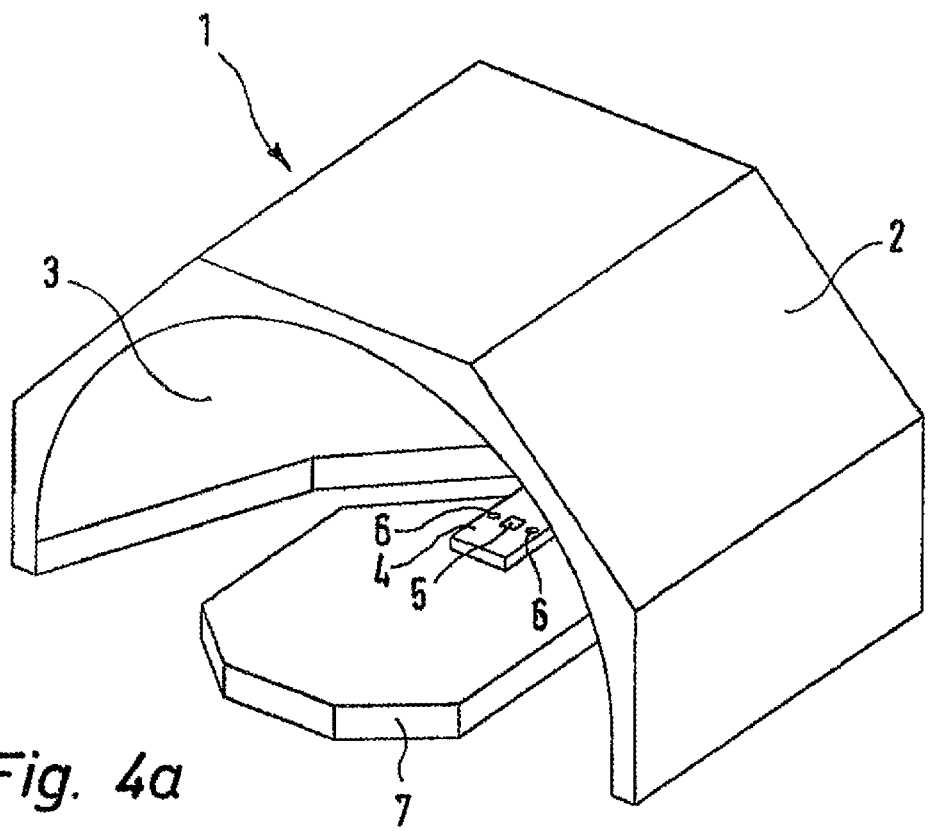
FIG. 4a illumination module of a known semiconductor light source headlamp.
Figure 4B:
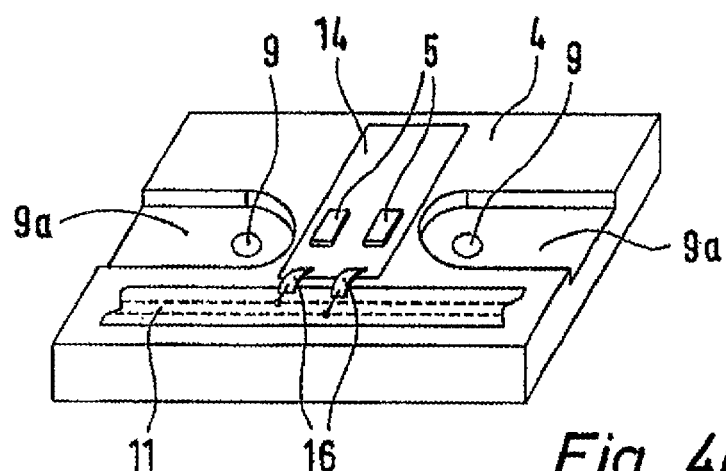
Figure 5:
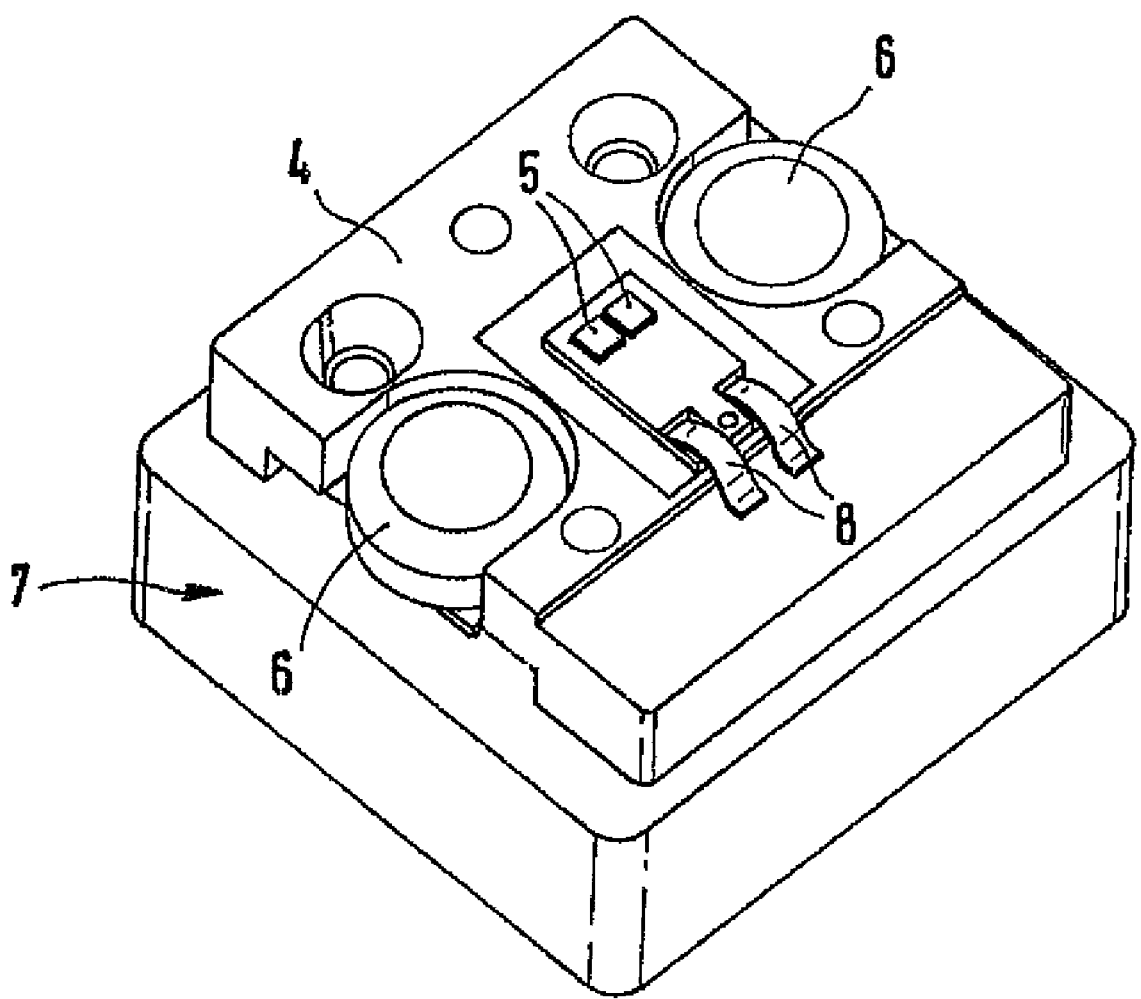

This invention concerns an illumination module for a headlamp or a illumination system of an automobile with a semiconductor light source (LED) mounted on a carrier element. In a schematic view of an advantageous embodiment, FIG. 1 shows a section of a illumination module 10 of such a semiconductor light source headlamp. The illumination module 10 includes a carrier element 4 (for LED's), which is attached to a heat sink 7. As a carrier element 4, a standard component is used that is sold under the name LAFLS (Lumileds Automotive Front Lighting Source) by the Philips Lumileds Lighting Company, San Jose Calif. The carrier element 4 used is shown in detail in FIG. 4b. The carrier element 4 possesses semi-round cavities 9a on two opposing sides that are recessed only over a part of the carrier element cross section. The carrier element 4 includes a circuit board 14 (so-called chip) in the center of its outer surface onto which several LED's 5 (two LED's 5 in the illustrated example) are positioned and placed into electrical contact. Of course, the form, configuration, and positioning of the recesses 9a, as well as the position and quantity of the LED's 5, may be varied from the illustrated embodiment example.

Contact with the LED's 5 on the chip 14 is by means of current bands 15, which connect the chip with contact surfaces on the upper side of the carrier element. These contact surfaces are preferably placed into electrical contact by means of a flexible conductor rail 11 after the carrier element 4 is mounted on the heat sink 7. The flexible conductor rail 11 is shown in FIG. 1 by dashed lines. Along with the illustrated illumination module 10, it may provide electrical energy to additional illumination modules mounted on the same heat sink 7, or on other heat sinks.

Based on the invention, the carrier element 4 is not secured (as previously) to the heat sink 7 by means of screws 6 that are inserted through drilled holes 9 into the carrier element 4, but rather by means of a rectangular, plate-shaped securing bracket 18. The securing bracket 18 is preferably produced of a springy material, e.g., metal or plastic. The securing bracket 18 includes in its interior a recess that essentially matches the contour of the carrier element 4. The carrier element 4 is affixed to the heat sink 7 by means of the securing bracket 18.

The securing bracket 18 includes tongue-shaped spring tabs 20 that extend over the carrier element 4 in the area of the recesses 9a to secure the carrier element 4 to the heat sink 7. The tabs 20 of the securing bracket 18 exactly engage the semi-round cavities 9a. The sidewalls of the cavities 9a form a limit stop on three sides and toward the floor of the cavities 9a for the tabs 20 of the securing bracket 18. The securing bracket 18 is attached to the heat sink 7, whereby the carrier element 4 with its LED's 5 is also affixed to the heat sink 7. Other possibilities of fixing the carrier element 4 using the securing bracket 18 are possible (e.g., by a rectangular shape of the recesses 9a and tabs 20; by a deviated position of the recesses 9a and the tabs 20; by a varied quantity of recesses 9a and tabs 20, etc.). It must in any case be ensured that the carrier element 4 can no longer move after the securing bracket 18 is engaged and secured, i.e., it is secured through all three dimensions to the heat sink 7. The securing bracket 18 positioned by means of two opposing lateral edges 19 bent downward at a distance from the surface of the heat sink 7.

The invention offers the decisive advantage that, by use of the securing bracket 18, standard carrier elements 4 with high flexibility may be attached in almost any manner to the heat sink 7. Decisive here is the fact that the securing points of the securing bracket 18 may be positioned on the heat sink 7 in almost any manner. In this manner, various dimensions and configurations of a heat sink may be taken into account in that the shape and dimensions of the securing bracket 18 may be adapted. Also, the securing bracket 18 fulfills additional functions such as, for example, the positioning and securing of the flexible conductor rail 11.

The securing bracket 18 itself may be attached to the heat sink 7 in many different ways. Screws, rivets, clips, engaging teeth, welding, soldering, adhering, etc. are conceivable. In the embodiment example from FIG. 1, for example, a groove is formed on the rear and the front sides of the heat sink 7 (rear groove not shown; front groove designated with reference index 15). The rear side of the securing bracket 18 includes a projection in the form of an edge projecting forward and at a distance from the underside of the device 18 that engages in the rear groove on the heat sink 7. When the rear edge is engaged in the groove, the edge and groove form a type of hinge about which the securing bracket 18 may be pivoted. On the front side of the securing bracket 18, an engaging tab 22 extending downward is formed with a projection directed downward that can engage in the front groove 15 to form an engaging catch connection between securing bracket 18 and heat sink 7. The securing bracket 18 thus is stretched over the carrier element 4, whereby the plate of the securing bracket 18 fulfills an effect similar to a leaf spring. The mounted securing bracket 18 is under tension, and presses the carrier element 4 onto the heat sink 7.

It is conceivable to secure the front side of the securing bracket 18 to the heat sink 7 using another type of attachment instead of the engaging connection. Of course, other screw connectors using one or more screws or rivets that connect the securing bracket 18 to the heat sink 7 at any points are possible.

Figure 2:
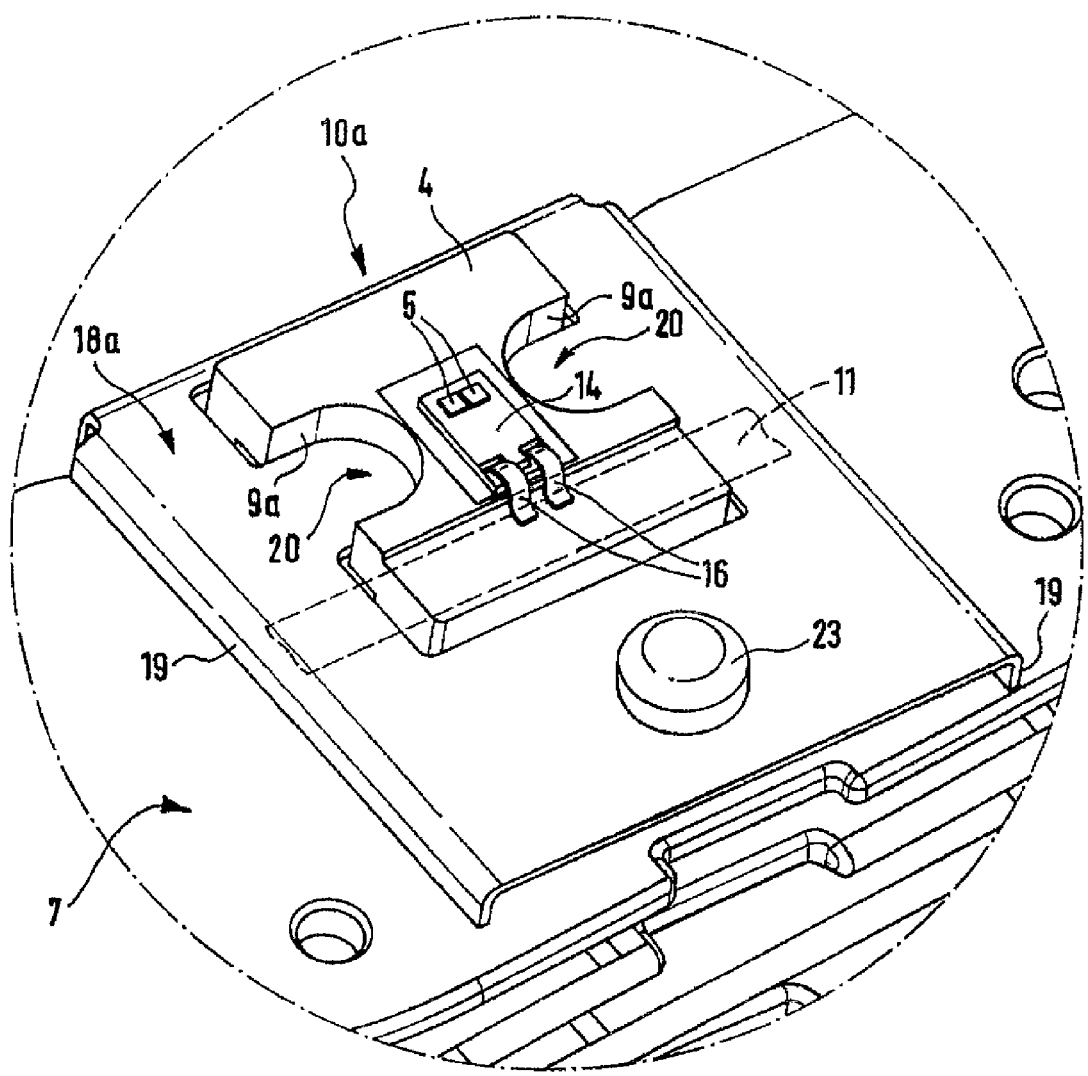
FIG. 2 second advantageous embodiment of an illumination module based on the invention.

FIG. 2 shows a second embodiment example of a illumination module based on the invention slightly altered from the embodiment example from FIG. 1 that is designated overall with the reference index 10a. The carrier element 4 shown for LED's 5 is identical in shape and configuration with the carrier element 4 from FIG. 1, and therefore possesses the same reference index. Of course, otherwise configured carrier elements might be used here. A securing bracket 18, preferably of a springy material, e.g., metal or plastic, is secured on the rear side by means of a projection of the securing bracket 18 in the form of an edge in a groove formed in the rear side of the heat sink 7 that acts like a hinge. Securing the securing bracket 18a on the front side is performed by means of a screw 23 that is fed from above through a drilled hole in the securing bracket 18a and is threaded into the heat sink 7. The position of the screw 23 may be selected at will, and essentially depends on the configuration of the heat sink 7 or the preference of the designer. The dimensions and configuration of the securing bracket 18a are selected depending on the desired position of the carrier element 4 or of the LED's 5.

Figure 3:
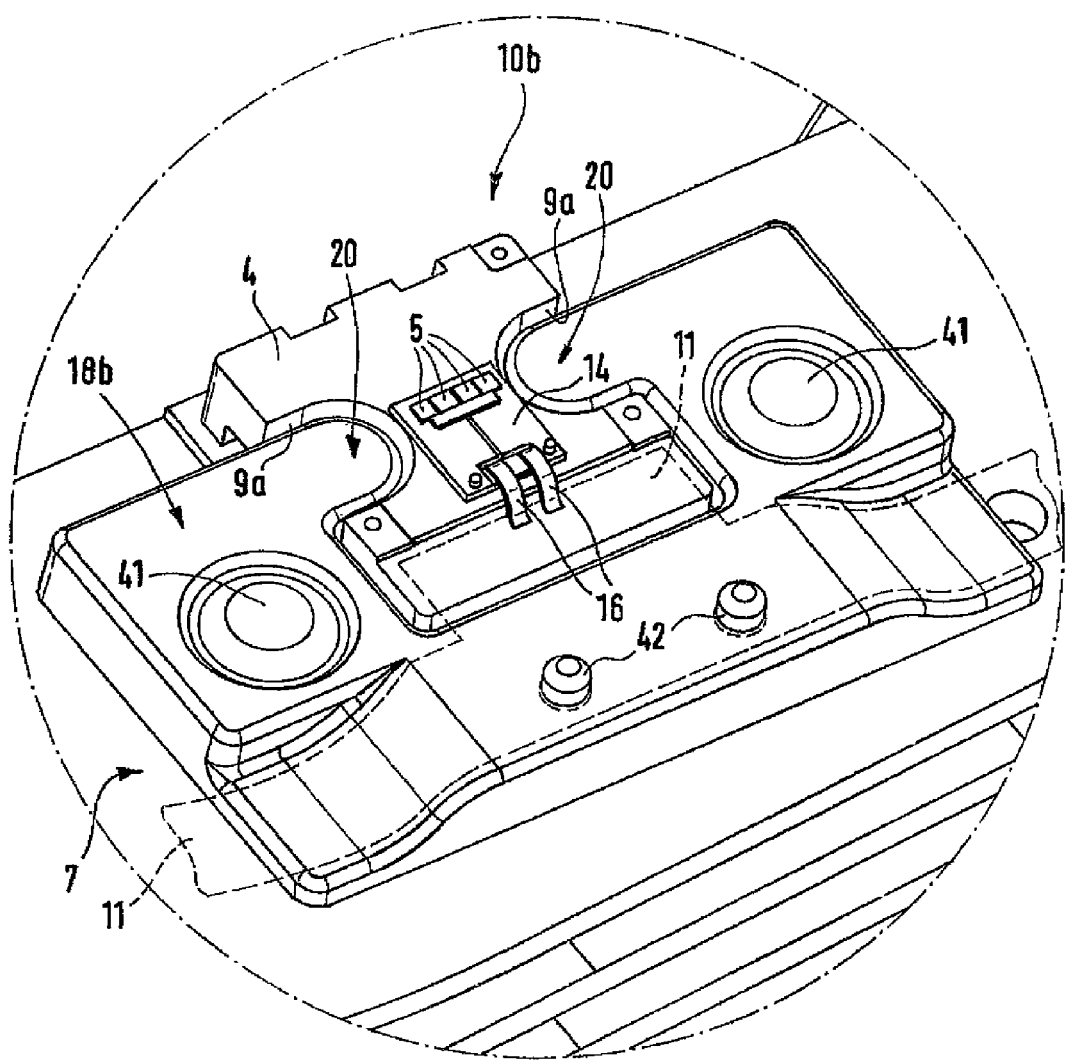
FIG. 3 third advantageous embodiment of an illumination module based on the invention.

FIG. 3 shows a third, alternative embodiment example of a illumination module based on the invention that is designated in its entirety with reference index 10b. A total of four LED's 5 is mounted on the shown carrier element 4 or on the chip 14, and is connected to the flexible strip conductor 11 by means of the current rails. The flexible strip conductor 11 in this embodiment example is positioned relative to the securing bracket 18b by means of the studs 42 projecting from the upper side of the securing bracket 18b that engage in apertures or cavities formed in the strip conductor 11. Additionally, means to secure the flexible strip conductor 11 to the securing bracket 18b may be provided. These may include, for example, a holding collar projecting radially on the far end of the stud 42 that possesses a larger diameter than the apertures or cavities in the flexible strip conductor 11. The strip conductor 11 may thus be drawn over the collar of the studs 42 in the manner of a barb and secured to the securing bracket 18b. Alternatively, additional separate means may be provided to secure the flexible strip conductor 11 to the securing bracket 18b. These include, for example, a rivet (not shown) of plastic or metal that is inserted through suitable apertures in the strip conductor 11 into the securing bracket 18b and is anchored there.

The flexible strip conductor 11 of the embodiment example shown in FIG. 3 is essentially tape-shaped, and includes a projection in the area of the illumination module 10b that extends in the direction of the carrier element 4 and allows contact of the strip conductor 11 with the contact surfaces on the end of the current rails 16. The recess in the securing bracket 18b to receive the carrier element 4 surrounds this only partially.

To secure the carrier element 4 to the heat sink 7, the securing bracket 18b is laid over the carrier element 4 so that it at least partially surrounds it, and is attached to the heat sink 7. For this, the spring-tab tongues 20 rest on the floor of the lateral recesses 9a of the carrier element 4. The securing bracket 18b is secured by screws 41 that are inserted from above through apertures in the securing bracket 18b and threaded into the heat sink 7. The quantity and position of the screws 41 may basically be selected dependent on the shape and dimensions of the securing bracket 18b and of the heat sink 7. The type of securing means may be freely selected. Even adhering the securing bracket 18b to the surface of the heat sink 7 is conceivable.

As an alternative to the routing of the flexible strip conductor 11 shown in FIG. 3, it is also conceivable that it be routed between the securing bracket 18b and the heat sink 7. This would be an interesting alternative if the carrier element 4 were at least partially placed into a cavity of the heat sink 7. In this case, studs projecting downward may be formed on the underside of the securing bracket 18*b* that extend into the matching apertures or drilled holes that are formed in the flexible circuit board 11 and in the upper side of the heat sink 7. The studs projecting downward may even be formed of the securing means 41 so that not only carrier element 4, but also the flexible circuit board 11, may be secured and positioned by the securing bracket 18*b*.

In a particularly simple and low-cost embodiment example of the invention, the securing bracket 18 may be in the shape of a wire-bale spring instead of a plate.

The invention claimed is:

1. An illumination module for a headlamp or an illumination system of an automobile with at least one semiconductor light source secured to a carrier element which includes at least two semi-round cavities each having a curved inner wall and a bottom wall, the cavities positioned opposite on the carrier element, whereby the carrier element is attached to a heat sink, by means of a separate securing bracket whereby the securing bracket includes a recess that at least partially surrounds the carrier element, is attached to the heat sink, and at least partially covers the carrier element, the bracket includes two tongue-shaped spring tabs positioned opposite each other wherein each of the tabs fit exactly within each of the at least two cavities of the carrier element whereby the walls of the cavities form a limit stop for each of the spring tabs.

2. The illumination module as in claim 1, characterized in that the carrier element is connected with the heat sink by means of the securing bracket so that it may be released.

3. The illumination module as in claim 2, characterized in that the securing bracket is secured to the heat sink in an area outside the carrier element.

4. The illumination module as in claim 2, characterized in that the securing bracket is attached to the heat sink on one side with a pivot-joint connection, and to the opposite side of the heat sink with a fixed connection.

5. The illumination module of claim 2, characterized in that the securing bracket is connected to the heat sink using threaded connectors.

6. The illumination module as in claim 1, characterized in that the securing bracket is secured to the heat sink in an area outside the carrier element.

7. The illumination module as in claim 6, characterized in that the securing bracket is attached to the heat sink on one side with a pivot-joint connection, and to the opposite side of the heat sink with a fixed connection.

8. The Illumination module of claim 6, characterized in that the securing bracket is connected to the heat sink using threaded connectors.

9. The illumination module as in claim 1, characterized in that the securing bracket is attached to the heat sink on one side thereof with a pivot-joint connection, and to the opposite side of the heat sink with a fixed connection.

10. The illumination module as in claim 9, characterized in that the securing bracket is attached, engaged, or screwed to the heat sink on the side of the heat sink opposite to the pivot-joint side.

11. The Illumination module of claim 1, characterized in that the securing bracket is connected to the heat sink using threaded connectors.

12. The illumination module as in claim 1, characterized in that the illumination module generates a low-beam or high-beam.

13. The illumination module as in claim 1, characterized in that the securing bracket includes means to position and secure a flexible circuit board to provide electrical energy to the minimum of one semiconductor light source.

14. The illumination module as in claim 1, characterized in that the cavities for the tongue-shaped spring tabs form a limit stop for the spring tabs.

15. The illumination module as in claim 1, characterized in that the securing bracket is plate shaped.

16. The illumination module as in claim 1, characterized in that securing bracket is shaped as a wire-bale spring.

* * * * *